United States Patent
Andric et al.

(10) Patent No.: US 6,515,861 B1
(45) Date of Patent: Feb. 4, 2003

(54) METHOD AND APPARATUS FOR SHIELDING ELECTROMAGNETIC EMISSIONS FROM AN INTEGRATED CIRCUIT

(75) Inventors: Anthony M. Andric, Lockhart, TX (US); Ruel Hill, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 29 days.

(21) Appl. No.: 09/824,148

(22) Filed: Apr. 2, 2001

(51) Int. Cl.$^7$ ................................. H05K 7/20
(52) U.S. Cl. ............... 361/709; 361/704; 361/719; 174/16.3; 257/713
(58) Field of Search ............... 361/702–712, 361/714–723, 760, 783, 802, 806, 816, 818, 820, 773, 683, 687–690, 832; 257/659, 660, 691, 625, 706–727, 778, 796; 174/16.3, 35 R, 260, 51, 35 GC; 165/80.3, 80.4, 80.2, 185, 165; 248/316.7, 500–510

(56) References Cited

U.S. PATENT DOCUMENTS

| | | | | |
|---|---|---|---|---|
| 4,394,633 A | * | 7/1983 | Klein ........................... | 333/238 |
| 4,942,400 A | * | 7/1990 | Tarzaiski et al. ............. | 341/155 |
| 5,175,613 A | * | 12/1992 | Barker et al. ................ | 257/713 |
| 5,297,007 A | | 3/1994 | Deyo et al. .................. | 361/707 |
| 5,311,402 A | * | 5/1994 | Kobayashi et al. .......... | 361/704 |
| 5,371,404 A | * | 12/1994 | Juskey et al. ................ | 257/659 |
| 5,486,720 A | * | 1/1996 | Kierse ......................... | 257/659 |
| 5,566,052 A | * | 10/1996 | Hughes ........................ | 361/704 |
| 5,592,391 A | * | 1/1997 | Muyshondt et al. ......... | 364/489 |
| 5,625,228 A | * | 4/1997 | Rogren ........................ | 257/712 |
| 5,781,074 A | * | 7/1998 | Nguyen et al. .............. | 331/105 |
| 5,804,875 A | * | 9/1998 | Remsburg et al. ........... | 257/718 |
| 5,838,542 A | | 11/1998 | Nelson et al. ............... | 361/704 |
| 5,866,943 A | * | 2/1999 | Metrol ......................... | 257/712 |
| 5,901,040 A | | 5/1999 | Cromwell et al. ........... | 361/704 |
| 5,914,859 A | * | 6/1999 | Takada et al. ............... | 361/704 |
| 5,986,340 A | | 11/1999 | Mostafazadeh et al. ..... | 257/713 |
| 6,011,299 A | | 1/2000 | Brench ......................... | 257/660 |
| 6,011,691 A | | 1/2000 | Schreffler .................... | 361/704 |
| 6,037,659 A | * | 3/2000 | Weixel ......................... | 257/717 |
| 6,057,601 A | * | 5/2000 | Lau et al. ..................... | 257/738 |
| 6,071,128 A | * | 6/2000 | Brewington et al. .......... | 439/73 |
| 6,195,266 B1 | | 2/2001 | Padgett et al. ............... | 361/799 |
| 6,243,265 B1 | * | 6/2001 | Wong et al. .................. | 361/704 |
| 6,246,583 B1 | * | 6/2001 | Cronin et al. ................ | 361/704 |
| 6,392,888 B1 | * | 5/2002 | Chen et al. ................... | 361/704 |

FOREIGN PATENT DOCUMENTS

| | | | | |
|---|---|---|---|---|
| EP | 0853340 A2 | * | 7/1998 | ......... H01L/23/367 |
| JP | 409027576 A | * | 1/1997 | ........... H01L/23/40 |
| JP | 411260976 A | * | 9/1999 | ........... H01L/23/36 |

* cited by examiner

*Primary Examiner*—Darren Schuberg
*Assistant Examiner*—Michael Datskovsky
(74) *Attorney, Agent, or Firm*—Zagorin, O'Brien & Graham, LLP

(57) ABSTRACT

A conductive plane of an integrated circuit package and a heatsink combine to form a structure for controlling electromagnetic emissions from the integrated circuit die that is mounted in the package. The heatsink includes a base and a projecting portion extending from the base. The projecting portion is electrically connected to an exposed ground plane in the package. The projecting portion defines a recess positioned over the integrated circuit die, which thermally engages the integrated circuit die.

25 Claims, 2 Drawing Sheets

METHOD AND APPARATUS FOR SHIELDING ELECTROMAGNETIC EMISSIONS FROM AN INTEGRATED CIRCUIT

BACKGROUND OF THE INVENTION

1. Field of the Invention

The present invention pertains to the control of electromagnetic emissions from an electronic device and, more particularly, from an integrated circuit device.

2. Description of the Related Art

An integrated circuit ("IC") can emit or radiate electromagnetic ("EM") waves directly from the die on which the actual circuits are formed. Once the EM emissions radiate into the open area of a computing system's chassis, it can be very difficult to contain. The EM emissions can leak from the chassis into the surrounding environment. These emissions can therefore cause a variety of significant problems when the ICs are employed in computing system. The emissions can conceivably generate electronic noise in neighboring devices that interfere with their operation. Also, the Federal Communications Commission ("FCC") regulates the amount of EM emissions from a variety of commercially sold products, and emissions from an IC, e.g., the processor of a computing system, can cause the computing system to fail FCC emission requirements.

Current techniques address the EM emissions problem in a variety of ways. One approach is to design the IC to minimize the amount of EM radiation that is emitted. However, IC design frequently involves trade-offs among competing considerations. Performance or other types of considerations sometimes take precedence. It can also be difficult to estimate the level of EM emissions from a particular IC design until the IC design is fully embodied in an operational prototype. But once the IC design has been reduced to practice, there typically is very little that can be done to mitigate the EM radiation from the IC.

Another conventional technique adds EM shielding and gasketing around the inside of the chassis that contains the IC to prevent the EM emissions from leaking. While that technique can be effective, it can add a relatively significant amount to the cost of manufacturing a computing system.

It would be desirable to reduce the problem of EM radiation associated with electronic systems in a cost effective manner.

SUMMARY OF THE INVENTION

Accordingly, the invention includes a method and apparatus for shielding electromagnetic emissions originating from an integrated circuit. In one embodiment the invention provides an apparatus that includes a packaged integrated circuit. The package encloses at least one conductive plane, and at least a portion of the surface of the package is absent to expose at least a portion of the conductive plane. An integrated circuit die is mounted to the package. A heatsink thermally contacts the integrated circuit die. The heatsink includes a base and a projecting portion extending from the base to electrically couple to the conductive plane, the projecting portion defining a recess positioned over the integrated circuit die to enclose, in conjunction with the package, the integrated circuit die.

In another embodiment, the invention provides an apparatus that includes a heatsink that includes a base portion and a projecting portion having sides extending from the base portion, the projecting portion defining a recess for positioning over an integrated circuit die. The apparatus may further include a package for mounting the integrated circuit die, the package enclosing at least one conductive plane, at least a portion of a surface of the package being absent to expose at least a portion of the conductive plane; and wherein the heatsink is electrically coupled to the conductive plane through the projecting portion.

In another embodiment the invention provides a method that includes electrically coupling a heatsink and a conductive plane of an integrated circuit package thereby providing a structure to limit electromagnetic emissions from an integrated circuit die mounted in the package.

In another embodiment the invention provides a method of making a heatsink for use in controlling electromagnetic emissions from an integrated circuit. The method includes forming a recessed portion in a surface of the heatsink, the recessed portion including a thermal engagement portion for thermally engaging an integrated circuit die. The recessed portion has a top surface and side walls, the side walls providing an engagement surface for electrically coupling to a package holding the integrated circuit die.

In another embodiment the invention provides a method for controlling electromagnetic emissions from an integrated circuit die mounted in a package, that includes thermally engaging the integrated circuit die with at least part of a recessed portion of a heatsink; and electrically connecting a projecting portion of the heatsink, which defines the recessed portion, to a conductive plane of the package, thereby providing a Faraday cage defined by a heatsink and the conductive plane.

BRIEF DESCRIPTION OF THE DRAWINGS

The invention may be understood by reference to the following description taken in conjunction with the accompanying drawings, in which like reference numerals identify like elements, and in which.

Figure 1:
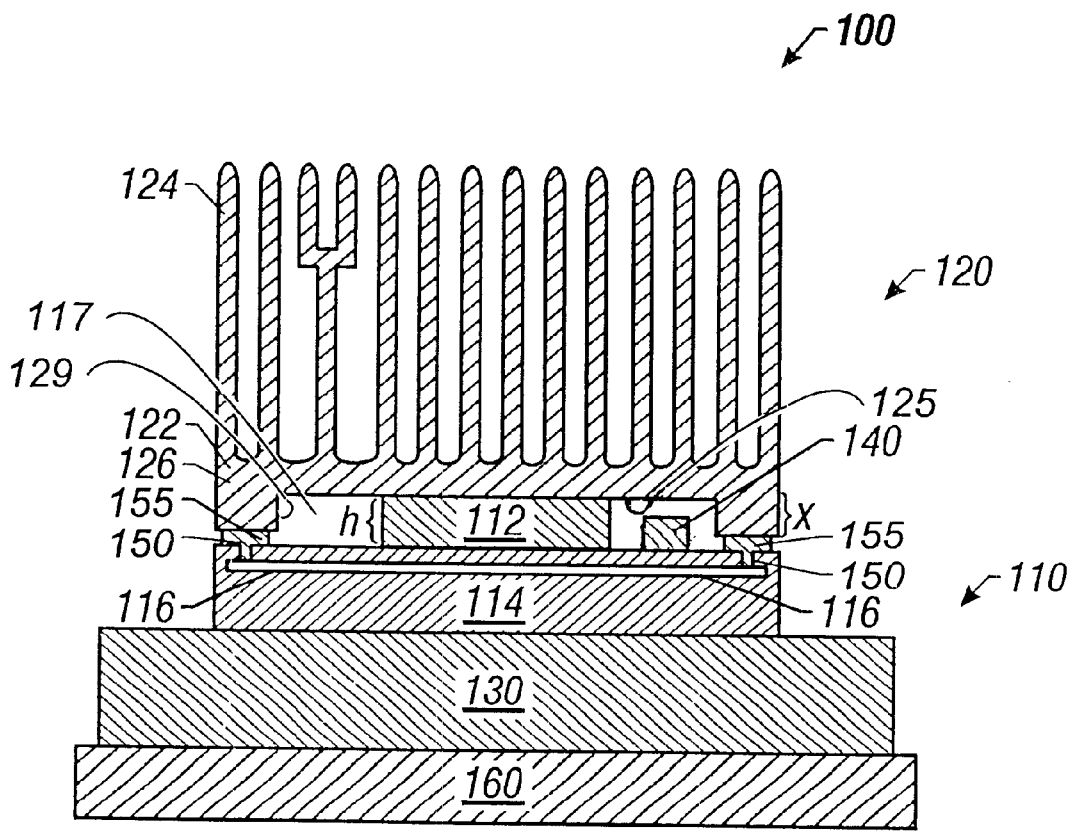
FIG. 1 is a cross-section of a portion of an apparatus constructed in accordance with an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENT(S)

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2:
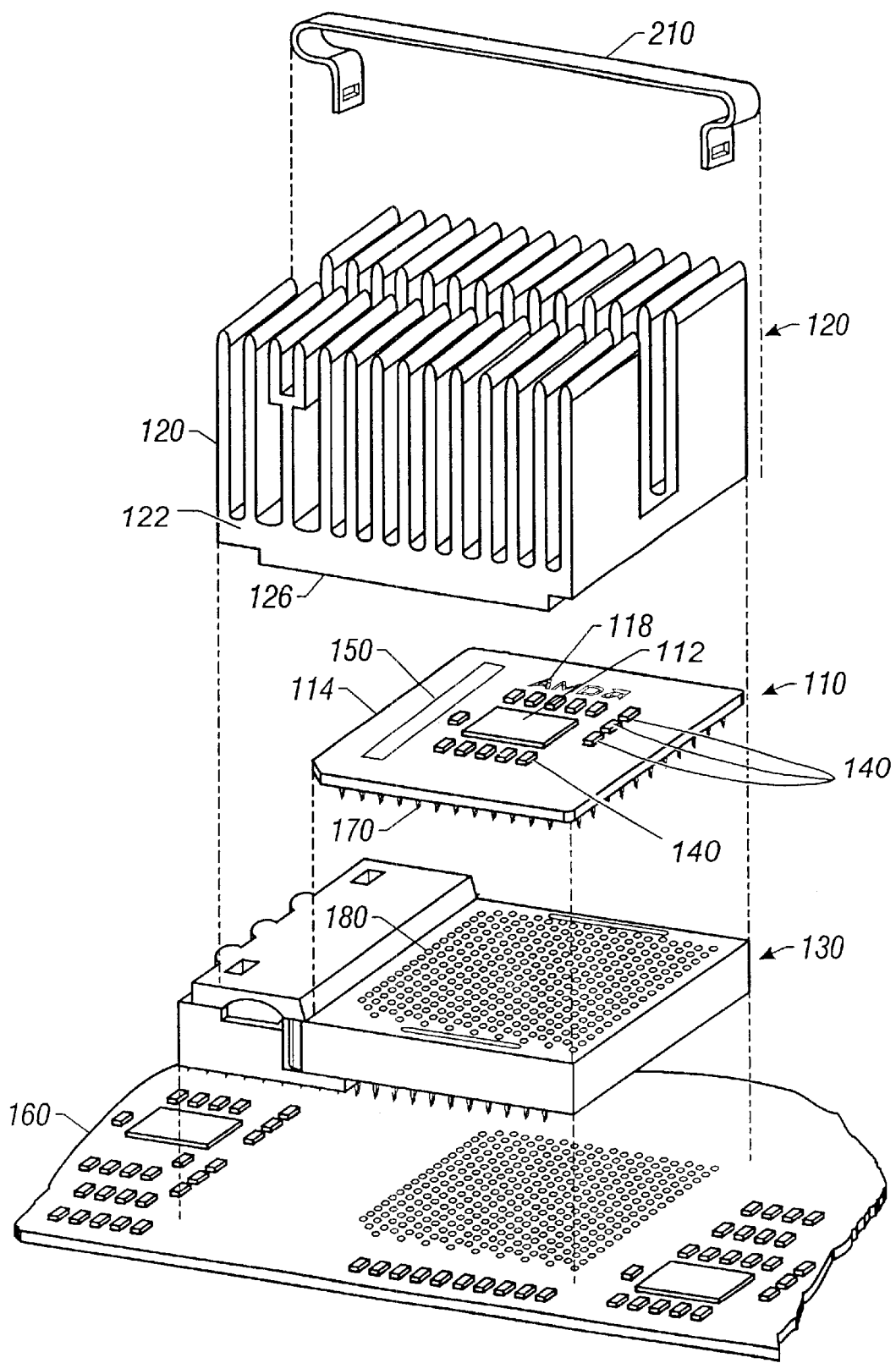
FIG. 2 is an exploded, isometric view of the embodiment illustrated in FIG. 1.

Turning now to the drawings, FIG. 1 and FIG. 2 depict one particular embodiment of an apparatus 100 constructed in accordance with the present invention. FIG. 2 is an exploded, isometric view of the apparatus 100 of FIG. 1. The apparatus 100 comprises packaged IC 110 on which a heatsink 120 is mounted. The IC 110 includes an IC die 112 mounted on a package 114 in a conventional fashion. The heatsink 120 includes a base 122 and a plurality of fins 124 extending upwardly therefrom. Note that the fins 124 are not necessary to the practice of the invention, but are generally preferred for their heat dissipation abilities. The heatsink 120 also includes a projecting portion 126 around the base 122, whose fabrication, structure, and function are described more fully below.

The IC 110 may be any kind of IC, e.g., a processor such as a microprocessor or a digital signal processor. In the particular embodiment shown, the IC 110 is shown mounted to a socket 130. Note that the socket 130 is not necessary for the practice of the invention. As will be appreciated by those in the art having the benefit of this disclosure, ICs are frequently mounted to boards, e.g., the board 160, using sockets such as the socket 130, but may alternatively be mounted directly. Microprocessors are typically mounted using sockets such as the socket 130. Where a socket is employed, however, the IC 110 may be mounted to the socket 130 in any manner known to the art, e.g., by inserting pins 170 (shown in FIG. 2) in the package 114 into receptacles 180 (also in FIG. 2) in the socket 130. The IC 110 also includes a capacitor 140 mounted on the surface of package 114. The capacitor 140 also is not necessary to the practice of the invention but are common components for ICs of this type. The IC 110, heatsink 120, and socket 130 are then assembled (as described further below) and mounted to the board 160.

The package 114 may be constructed from any suitable material known to the art for this purpose, e.g., a ceramic or an organic material. The package 114 encloses a conductive plane 116, such as a ground plane, (shown in FIG. 1) in a conventional manner to which the heatsink 120 is electrically connected as is discussed further below. As those in the art having the benefit of this disclosure will appreciate, an IC package usually will enclose several conductive planes including the ground plane 116. Furthermore, the various ground planes may present different grounds, e.g., a digital ground, an analog ground, a chassis ground, etc. In the particular embodiment illustrated, the conductive plane 116 is a digital ground, but any reference potential may be used. In one particular implementation, the IC 110 includes a pin (not shown) dedicated to obtaining a chassis ground from the board 160 for use in grounding the heatsink 120.

The ground plane 116 is exposed by openings 150 in package 114. In a preferred embodiment, the ground plane is exposed continuously on all four sides to form a ring (only one side shown in FIG. 2 so as to enable illustration of other features). As will be appreciated by those skilled in the art, IC manufacturers commonly create package openings such as openings 118 to convey such information as the manufacturer, the model, and the site of manufacture of the IC, for instance. That is particularly true where the first layer below the packaging is not only an electrically conductive layer, but is a ground plane. Thus, an IC manufacturer, in some embodiments, may not need to significantly alter the manufacturing process to create the openings 150 in the package 114 to expose the ground plane 116. The opening in the package 114 may be created in any suitable manner such as etching the package or masking appropriately during package fabrication. The manufacturing process may also exploit the openings 118 placed for identification purposes to electrically couple the heatsink to the package 114.

Turning now to the heatsink 120, the projecting portion 126 extends from the base 122 for a distance "x" sufficient (shown in FIG. 1) for the projecting portion 126 to electrically couple the heatsink 120 to the exposed ground plane 116. The projecting portion 126 may be fabricated by milling a recess 117 into the base 122. Such milling techniques are well known in the art. Conventional heatsinks are frequently milled for a variety of reasons, e.g., to accommodate a switch on a socket. The same milling tools and techniques may be used to mill the recess 117.

The magnitude of the distance x will be implementation specific, and will depend on a number of factors. In the illustrated embodiment, a solder ring 155 (see FIG. 1) is formed in the opening 150 to provide the electrical connection between the conductive plane 116 and the heatsink 120. The solder might alternatively be laid as a series of solder bumps or small dots of solder rather than in a layer. Conductive materials other than solder may also be used, as will be appreciated by those skilled in the art. The solder ring in a preferred embodiment goes completely around all four sides of the die and the capacitors. In an embodiment, the heatsink, solder ring and package hermetically seal the die. Note that the heatsink in a preferred embodiment in non-anodized.

In one particular embodiment, the distance x is at least as great as the height h of the IC die 112 above the package 114 to provide tolerance in the manufacturing process and to help reduce costs. Thus, the distance x will depend on factors such as the height h of the IC die 112, the depth of the openings 118, and the amount of build-up (e.g., thickness of the layer of solder 155). Whether one or more of these factors is even present will be implementation specific. For instance, although more expensive, the projecting portion 126 may be milled to create plugs (not shown) on its bottom edge that will plug into the openings 150. In this implementation, there is no solder build-up and the distance x must be greater than the height h to establish the requisite electrical contact. Conversely, a large amount of solder build-up (e.g., a thick layer of the solder 150) can decrease the required distance x. Note, however, that the distance x is such that the base 122 of the heatsink 120, or at least some portion of the heatsink 120, is in thermal contact with the IC die 112. The heatsink 120 and the IC die 112 may be separated by a thin film of thermal grease (not shown) or other thermal interface material.

As perhaps shown best in FIG. 2, the apparatus 100 can be assembled by first mounting the socket 130 to the board and the IC 110 to the socket 130 in conventional fashion. In the illustrated embodiment, the layer of solder 155 or a series of solder bumps is then laid on the openings 150. In one embodiment thermal grease (not shown) may be applied to the top of the IC die 112 and the heatsink 120 is then mounted on top the IC die 112 and package 114 to electrically couple the heatsink 120 to the package 114 through the solder ring 155. The heatsink 120 may then be clamped in place by the clamp 210 in conventional fashion. Note that the solder should be soft enough that the die stops the heatsink on assembly to ensure good thermal contact between the heatsink and the die and good electrical contact between the heatsink and the package.

As those in the art having the benefit of this disclosure will appreciate, the base 122 and projecting portion 126 of the heatsink 120 and the ground plane 116 form a "Faraday cage" for the integrated circuit die 112. A Faraday cage is a six-sided structure employed to control electromagnetic emissions. In the illustrated embodiment, the Faraday cage is defined by the ground plane 116 of the package 114, the bottom surface 125 of the recess 117, and the interior surface 129 of the projecting portion 126. Note that, in the illustrated embodiment, the projecting portion 126 is rectangularly shaped. Thus, the internal surface 129 provides four sides of the Faraday cage. However, the invention is not so limited and the projecting portion 126 may be implemented in other geometries, albeit possibly with lesser performance.

Note that the projecting portion 126 need not necessarily be continuous around the perimeter of the heatsink 120 although in one preferred embodiment, both the projecting portions and the exposed ground plane form a ring. Openings (not shown) may be included in the projecting portion 126, provided they are sufficiently small (e.g., less the 1/20 of the wavelength of the anticipated radiation).

The particular embodiments disclosed above are illustrative only, as the invention may be modified and practiced in different but equivalent manners apparent to those skilled in the art having the benefit of the teachings herein. For instance, the electrical interface between the projecting portion 126 and the plane 116 to ground the heatsink 120 might be implemented using a "pluggable" projecting portion, i.e., a separate projecting portion structure plugging into the openings 150 around the IC die 116 and to which a conventional heatsink is affixed. Also, the projecting portion 126 might be implemented in geometries other than that shown, e.g., circular, oval, square, hexagonal, or octagonal. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus comprising:
    an integrated circuit, including,
        a package enclosing at least one conductive plane, at least a portion of the top surface of the package being absent to expose at least a portion of the conductive plane;
        an integrated circuit die mounted to the package;
    a heatsink mounted on the integrated circuit and thermally contacting the integrated circuit die, the heatsink including,
        a base; and
        a projecting portion extending from the base to electrically couple to the conductive plane, the projecting portion defining a recess positioned over the integrated circuit die to enclose, in conjunction with the package, the integrated circuit die.

2. The apparatus of claim 1, wherein the projecting portion extends to a distance at least as great as the height of the integrated circuit die above the package.

3. The apparatus of claim 1, wherein the integrated circuit comprises a processor.

4. The apparatus of claim 1, wherein the package comprises a material selected from the group consisting of a ceramic and an organic.

5. The apparatus of claim 1, wherein the exposed conductive plane comprises a digital ground plane.

6. The apparatus of claim 1, further comprising conductive material coupled between and electrically connecting the projecting portion and the exposed conductive plane.

7. The apparatus of claim 6, wherein the conductive material is solder.

8. The apparatus of claim 1, wherein the projecting portion is discontinuous.

9. The apparatus of claim 1, wherein the projecting portion defines a recess whose volume is sufficient to encompass the integrated circuit die.

10. The apparatus of claim 1, further comprising a socket to which the integrated circuit is mounted.

11. An apparatus comprising
    a heatsink including,
        a base portion; and
        a projecting portion having sides extending from the base portion, the projecting portion defining a recess for positioning over an integrated circuit die;
    a package for mounting the integrated circuit die, the package enclosing at least one conductive plane, at least a portion of a surface of the package being absent to expose at least a portion of the conductive plane; and
    wherein the heatsink is electrically coupled to the conductive plane through the projecting portion.

12. The apparatus of claim 11, wherein the projecting portion extends to a distance at least as great as the height of the integrated circuit die above the package.

13. The apparatus of claim 12, wherein the package comprises a material selected from the group consisting of a ceramic and an organic.

14. The apparatus of claim 11, further comprising conductive material coupled between and electrically connecting the projecting portion and the exposed conductive plane.

15. The apparatus of claim 14, wherein the conductive material is solder.

16. A method comprising
    electrically coupling a heatsink and a conductive plane of an integrated circuit package thereby providing a structure to limit electromagnetic emissions from an integrated circuit die mounted in the package;
    coupling the heatsink to the conductive plane through projecting portions extending from a periphery of heatsink; and
    removing a portion of a surface of the package to expose the conductive plane.

17. The method of claim 16, further comprising using solder to electrically couple the heatsink and the conductive plane of the package.

18. The method of claim 16 wherein the projecting portions define a recess in the heatsink at least a portion of which thermally engages the integrated circuit die.

19. The method as recited in 16 wherein the conductive plane is a ground plane.

20. A method of making a heatsink for use in controlling electromagnetic emissions from an integrated circuit, comprising;
    forming a recessed portion in a surface of the heatsink, the recessed portion including a thermal engagement surface for thermally engaging an integrated circuit die, the recessed portion having a top surface and side walls, the side walls providing an engagement surface for electrically coupling to a package holding the integrated circuit die.

21. The method as recited in claim 20 wherein the engagement surface for being electrically connected extends past the thermal engagement surface.

22. The method as recited in claim 20 further comprising forming the recessed portion by milling.

23. A method for controlling electromagnetic emissions from an integrated circuit die mounted in a package, comprising:

thermally engaging the integrated circuit die with at least part of a recessed portion of a heatsink; and electrically connecting a projecting portion of the heatsink, which defines the recessed portion, to a conductive plane of the package, thereby providing a Faraday cage defined by a heatsink and the conductive plane wherein at least a portion of a surface of the package being absent to expose at least a portion of the conductive plane.

24. The method as recited in claim 23 wherein the projecting portion of the heatsink and the conductive plane of the package are electrically connected with solder.

25. An apparatus comprising:
an integrated circuit die; and
means for controlling electromagnetic emissions from the integrated circuit die, using a heatsink and a ground plane of the package holding the integrated circuit die.

* * * * *